(12) United States Patent
Ballantyne

(10) Patent No.: US 6,954,627 B2
(45) Date of Patent: Oct. 11, 2005

(54) BLIND MODULATION CANCELLATION BY ADDITION OF MODULATED SIGNAL

(75) Inventor: Gary John Ballantyne, Christchurch (NZ)

(73) Assignee: Qualcomm, Incorporated, San Diego, CA (US)

( * ) Notice: Subject to any disclaimer, the term of this patent is extended or adjusted under 35 U.S.C. 154(b) by 221 days.

(21) Appl. No.: 10/187,087

(22) Filed: Jun. 28, 2002

(65) Prior Publication Data

US 2004/0002300 A1 Jan. 1, 2004

(51) Int. Cl.[7] .................................................. H04B 1/10
(52) U.S. Cl. ...................... 455/296; 455/63.1; 455/78
(58) Field of Search ............................... 455/296, 63.1, 455/67.11, 24, 73, 78, 295, 311, 501

(56) References Cited

U.S. PATENT DOCUMENTS

| | | | | |
|---|---|---|---|---|
| 3,696,429 A | * | 10/1972 | Tressa | 370/278 |
| 4,475,243 A | * | 10/1984 | Batlivala et al. | 455/22 |
| 4,710,723 A | * | 12/1987 | Pelchat et al. | 332/183 |
| 5,691,978 A | * | 11/1997 | Kenworthy | 370/278 |
| 6,137,888 A | * | 10/2000 | McClennon et al. | 381/318 |
| 6,311,045 B1 | * | 10/2001 | Domokos | 455/78 |
| 6,539,204 B1 | * | 3/2003 | Marsh et al. | 455/63.1 |
| 6,567,649 B2 | * | 5/2003 | Souissi | 455/83 |

* cited by examiner

Primary Examiner—Nguyen T. Vo
Assistant Examiner—Blane J. Jackson
(74) Attorney, Agent, or Firm—Philip R. Wadsworth; Thien T. Nguyen

(57) ABSTRACT

A signal processing method, applied in a wireless communications module having a receive path, prevents a nonlinear device in the receive path from using an amplitude modulated transmit or other bleed-over signal in the receive path to modulate a non-amplitude modulated jammer signal on the receive path (or to further modulate an already amplitude modulated jammer signal). The bleed-over signal is conditioned by adding one or more amplitude modulated dummy signal(s) having an envelope that complements an envelope of the bleed-over signal, forcing the nonlinear circuit to operate linearly with respect to the jammer signal. Output of the amplifier may be filtered to remove signals having bandwidths of the dummy signal(s), bleed-over signal, jammer signal, and any intermodulation products generated by introducing the dummy signal(s).

3 Claims, 6 Drawing Sheets

BLIND MODULATION CANCELLATION BY ADDITION OF MODULATED SIGNAL

BACKGROUND

1. Field

The present invention concerns a method of conditioning a wireless communication module's receive path to prevent transmit or other signals bled onto the receive path from modulating a relatively strong jammer (interference) signal via an amplifier or other nonlinear device, and possibly spreading the jammer signal into the frequency band occupied by relatively weaker receive signals of interest from remote stations. By combining the amplitude modulated bleed-over signal with a prescribed dummy signal, the nonlinear device in the receive path is forced to operate in a linear regime with respect to the jammer signal, leaving the jammer signal unmodulated (or, at least, free from added modulation). The dummy, bleed-over, and jammer signals (and any other signals generated upon introduction of the dummy signal) may then be filtered from the nonlinear device's output.

2. Background

A circuit is "linear" when it applies the same function to input signals regardless of the input signals' characteristics. For instance, a circuit is free from amplitude dependent nonlinearity if it applies the same function to input signals whether they have a small amplitude or a large amplitude. Conversely, a circuit exhibits amplitude dependent nonlinearity if its function changes according to the amplitude of the input signal. One example of a circuit with amplitude dependent nonlinearity is an amplifier that multiplies small amplitude input signals by ten, but with input signals of increasing amplitude, multiplies them by successively lesser numbers such 9.8, 9.7, 9.6, 9.5, and so on. The amplifier's behavior is therefore dependent upon the magnitude of its input signal.

Nonlinearity is an inherent property of many circuits as well as various circuits elements such as transistors, and it may even be desirable in different situations. In processing amplitude modulated communication signals, however, nonlinear circuit elements are definitely undesirable. Amplitude modulated signals, by definition, express information by the manner in which the amplitude of a signal's envelope varies. With this amplitude variation, nonlinear circuits therefore process amplitude variant signals inconsistently—the same function is not applied universally. One effect of this is that the input signal's frequency bandwidth is broadened. For example, an input signal that initially occupies a narrow frequency bandwidth ends up occupying a wider range of frequencies. Therefore, circuits with amplitude dependent nonlinearity often increase the bandwidth of amplitude modulated input signals.

This frequency spreading can cause problems. For example, a communication device's output signal, broadened by the nonlinear effect described above, may overlap into the frequency being used by another device of the same type. As a more particular example, a first cordless telephone's transmissions may overlap into the frequency channel being used by a second cordless telephone to receive. This is called "interference" and can significantly degrade the second phone's operation. Moreover, if a device is using a channel on the edge of the allocated frequency band for such devices, the device's transmissions may even overlap into the frequency band for unrelated devices. Thus, a cordless phone may interfere with a different device that is not even a cordless phone.

Furthermore, in an especially pernicious type of interference, a device may even interfere with itself. In order to permit users to simultaneously talk and listen, most communication devices transmit on one frequency but receive on a different frequency. In some transceivers, the signal being transmitted ("transmit signal") to a remote station may inadvertently bleed over onto the receive path. The receive path often includes interference ("jammer signals"), which may be substantially stronger in amplitude than signals of interest ("receive signals"), which the transceiver is trying to receive from the remote station and process.

Necessarily, the receive path includes an amplifier because the receive signals are so weak. When the amplitude variant combination of transmit and jammer signals is fed to the receive amplifier, which is nonlinear across the range of varying amplitudes, the amplifier causes the jammer signal and transmit signal to experience frequency spreading. More particularly, the leaked transmit signal (having an envelope with varying amplitude) changes the gain of the amplifier. This has an effect on the jammer signal—if it was unmodulated, it is now modulated in a similar way as the transmit signal. If the jammer was originally modulated, it is now more modulated. This is called "cross-modulation," since the amplitude modulation of the transmit signal transfers (crosses) to the jammer. Due to the proximity of the receive frequency to typical interference frequencies, the frequency-spread jammer signal can overlap onto the receive frequency. Thus, the strong jammer signal substantially overshadows the receive signals, making them difficult to discern.

A number of approaches can be used in an attempt to combat this effect. One idea is to filter the receive amplifier's output to remove unwanted signals. However, if the frequency-spread jammer signal now occupies the same frequency bandwidth as the receive signals of interest, filtering is useless because it would also filter-out the receive signal itself. Another technique is to filter the transmit and jammer signals from the receive path before amplification. This technique is not entirely adequate because (a) the jammer is often too close to the receive signal to filter, and, (b), the transmit signal is also quite close, and expensive to filter since adequate good duplexers are large and expensive.

Consequently, due to certain unsolved problems, the receive signal processing of wireless transceivers is not always adequate for all applications.

SUMMARY

Broadly, one aspect of this disclosure involves a signal processing method applied in a wireless communications module having a receive path. This method prevents a nonlinear device in the receive path from using an amplitude modulated transmit or other bleed-over signal in the receive path to modulate a non-amplitude modulated jammer signal on the receive path (or to further modulate an already amplitude modulated jammer signal). The bleed-over signal is conditioned by adding one or more amplitude modulated dummy signal(s) having an envelope that complements an envelope of the bleed-over signal, forcing the nonlinear circuit to operate linearly with respect to the jammer signal. Output of the amplifier may be filtered to remove signals having bandwidths of the dummy signal(s), bleed-over signal, jammer signal, and any intermodulation products generated by introducing the dummy signal(s).

DETAILED DESCRIPTION

The nature, objectives, and advantages of the invention will become more apparent to those skilled in the art after considering the following detailed description in connection with the accompanying drawings.

Hardware Components & Interconnections
Introduction

Broadly, one facet of the present disclosure concerns a wireless communications module such as a transceiver, where its receive path is modified to prevent transmit signals (or other signals bled onto the receive path from the transmit path) from modulating a relatively strong jammer signal (arising from interference) via a nonlinearity, and thereby disguising the relatively weaker receive signals arriving from remote stations. The receive path's nonlinear amplifier is forced to treat the jammer signal linearly, since the amplitude modulated bleed-over signal is combined with a dummy signal having an envelope that complements the bleed-over signal envelope. Optionally, the dummy, bleed-over, and jammer signals (as well as any other products of introducing the dummy signal) may be filtered from the amplifier's output.

Although described in this particular context, the present disclosure additionally contemplates the more general application of these techniques to prevent any bleed-over signal (not necessarily transmit signals) occurring on a receive path from modifying a jammer or other strong signal present in the receive path. These concepts may applied to any bleed-over signal where the bleed-over signal and/or or the combined bleed-over/jammer signal has a known or measurable signal envelope.

Figure 1A:
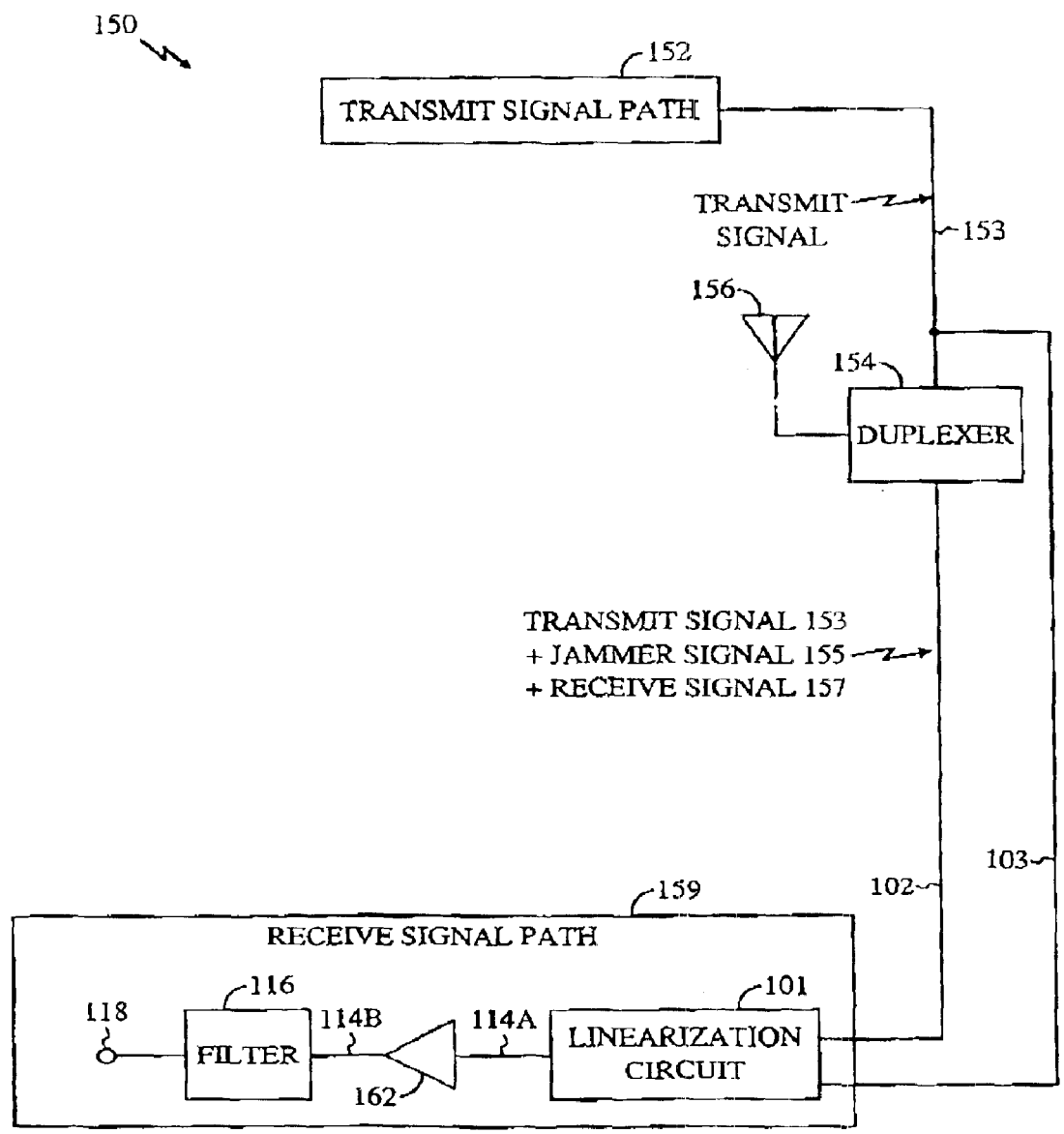
FIG. 1A is a block diagram of various hardware components and interconnections of a wireless transceiver.

FIG. 1A describes one example of wireless transceiver 150. The transceiver 150 includes a transmit signal path 152 and a receive signal path 159. The paths 152, 159 are coupled to an antenna 156 via a duplexer 154 that directs received signals from the antenna 156 to the receive path 159, and in the opposite direction directs transmit signals from the transmit path 152 to the antenna 142. The duplexer 154 may be implemented by a number of different well known designs, such as duplexers used in commercially available wireless telephones. Among other possible contexts, the duplexer is applicable in CDMA systems, which use different frequencies to transmit and receive. As also contemplated by the present disclosure, a switch (not shown) may be substituted for the duplexer for embodiments utilizing TDMA or other encoding that use the same frequency but different time slots to send and receive data. Depending upon the details of the application, a variety of other components may be used in place of the duplexer or switch, these components nonetheless serving to exchange transmit and receive signals with a common antenna. Alternatively, separate antennas may be used for transmitting and receiving, in which case the duplexer 154 may be omitted entirely.

The transmit signal path 152 includes various circuitry for encoding, modulating, amplifying, and otherwise processing signals for transmission to remote communications stations. The transmit signal path 152, for example, may be implemented by various known circuitry, such as that used in commercially available wireless telephones.

Generally, the receive signal path 159 includes components for decoding, demodulating, amplifying, and otherwise processing signals received from remote communications stations via the antenna ("receive signals"). Such components may be implemented by various known circuitry, such as that used in commercially available wireless telephones. One such component is the nonlinear device 162, which is exemplified by an amplifier that serves to amplify the relatively weak receive signals. As with some or all amplifiers, the amplifier 162 is a nonlinear device since it does not provide a fixed gain for all amplitudes of incoming signals.

The receive signal path 159 also includes a number of components that are not present in conventional transceivers, and whose novel use arises solely by the contribution of the present inventor(s). One such component is the linearization circuit 101, which forces the amplifier 162 to behave linearly by combining the amplitude modulated "source" signal (transmit plus jammer plus receive signals) with a dummy signal to provide a combined signal that is designed to be treated linearly by the amplifier 162. The circuit 101 has an input 102 coupled to the duplexer 154 (to obtain the source signal including the receive signal from the antenna 156), and also a second input 103 coupled to the transmit signal path 152 (to sample the transmit signal being transmitted from the path 152 via the antenna 156).

The path 159 also includes the filter 116, which may be provided by an existing filter normally used in a wireless communications receive path, or a completely new filter, or a combination of old and new components. The filter 116 selectively extracts the receive signal from the amplifier's output. The foregoing components are discussed in greater detail below.

Linearization Circuit—Generally

Figure 1B:
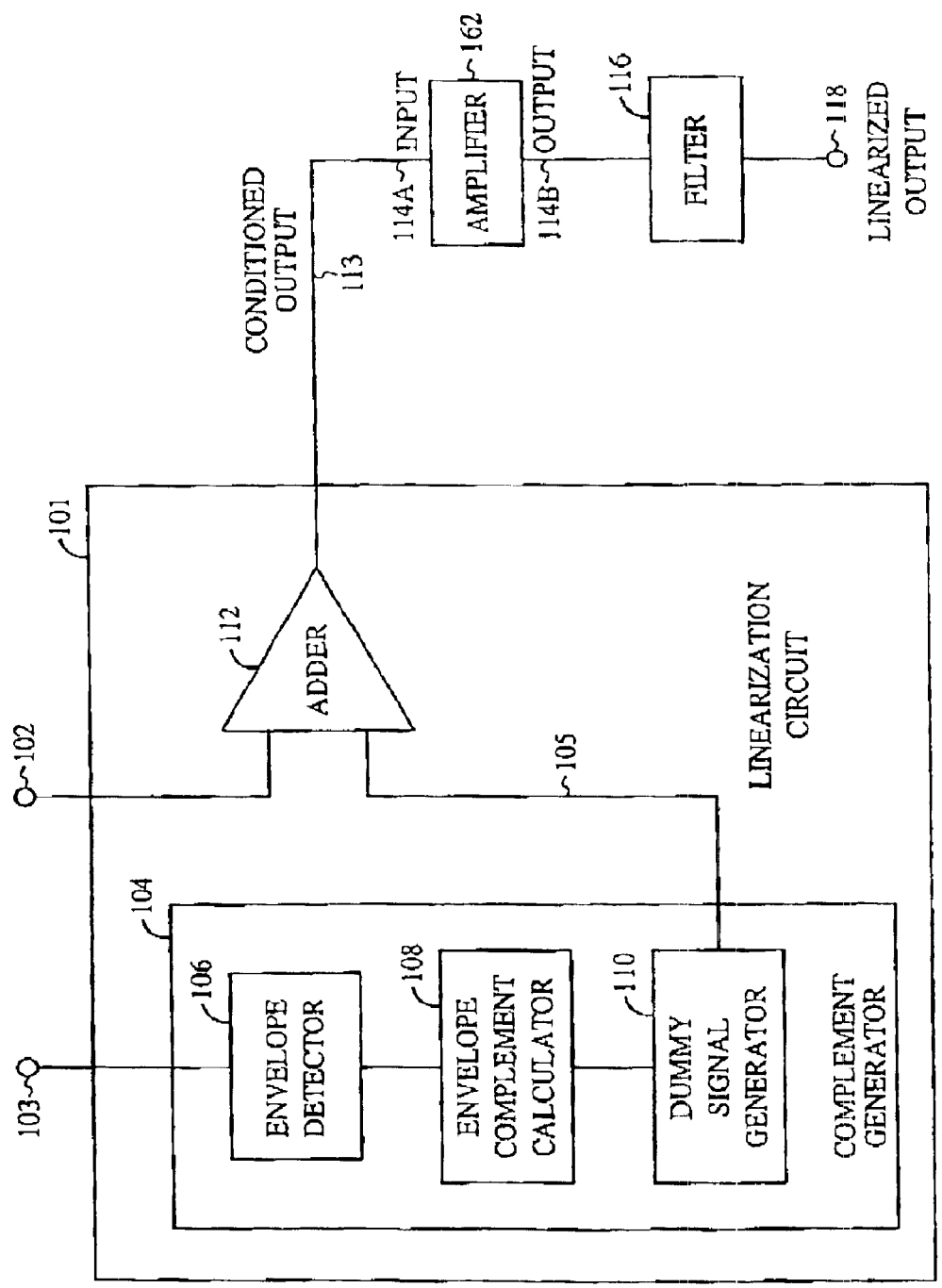
FIG. 1B is a block diagram of the hardware components and interconnections of an exemplary linearization circuit.

FIG. 1B shows additional detail of the components 116, 162, 101 of the receive signal path 159, according to one example. In FIG. 1B, various inputs and outputs are described, such as 102, 103, 113, 114a, 114b, 118, etc. Depending upon the context, these reference numerals are utilized to refer to hardware input/output lines ("inputs" and "outputs") as well as input signals and output signals present on such input/output lines. And, although the term "circuit" is used for ease of reference, the circuits described herein may be implemented by discrete electronics, printed circuit board traces, integrated circuitry, firmware, software, hardware, or a combination of any of the foregoing. The makeup of some exemplary subcomponents is described in greater detail below, with reference to an exemplary digital data processing apparatus, logic circuit, and signal bearing medium.

Conventionally, input signals (such as 102) are input directly to the amplifier 162, and the amplifier simply processes the input signal and provides its output (at 114b). Instead of this known approach, one feature of the present invention redirects the input signal 102 to the linearization circuit 101, which generates a conditioned signal 113 that is input to the amplifier 162 instead of the input signal 102. And, instead of considering the amplifier 162's output 114b as the final output, the filter 116 is used to further process this output 114b to provide a final, linearized output 118. The linearized output 118 is free from nonlinear effects of the amplifier 162 that would be present at 114b if the input signal 102 were provided directly to the amplifier 162.

Amplifier

As mentioned above, the receive signal path 159 includes an amplifier. Although exemplified herein as an amplifier 162, the teachings herein may be applied to mixers, filters, isolators, RF elements, or other nonlinear devices as well. The example of an amplifier 162 is utilized to discuss one embodiment of the disclosure with more specificity.

The amplifier 162 amplifies signals at its input 114a and produces a resultant output at 114b. The amplifier 162 is nonlinear, however, since the amount of amplification varies with the amplitude of the signal arriving at 114a. As a simple example, the amplifier 162 may seek to double the amplitude of its input signal 114a. In this case, if the input signal is 2 mV, the amplifier 162 produces an output of 4 mV. However, continuing with this example, performance of the amplifier 162 starts to degrade with input signals of greater amplitude. Instead of multiplying input signals by two, the amplifier 162 begins to multiply input signals by 1.95, and then 1.9 for larger amplitude input signals, then 1.85, and 1.80, etc. The amplifier 162 therefore exhibits amplitude dependent nonlinearity, since the function that it applies changes depending upon the amplitude of the input signal.

Advantageously, the present invention may be practiced without knowledge of the extent, behavior, or other specific characteristics of the amplifier 162's nonlinearity. In this sense, one aspect of the invention is "blind" linearization. Knowledge is only required of the amplifier 162's class of nonlinearity, and in particular, that the amplifier exhibits amplitude dependent nonlinearity. Thus, the amplifier 162 produces AM-AM and AM-PM distortion, meaning that the amplitude modulation (AM) of the input signal causes a nonlinear amplitude modulation of the output signal, and/or the amplitude modulation of the input signal causes nonlinear phase modulation (PM) of the output signal.

Linearization Circuit & Filter—Details

The linearization circuit 101 includes various preprocessing components between the input 102 and amplifier 162. These include a complement generator 104 and an adder 112. The complement generator 104 includes an envelope detector 106, an envelope complement calculator 108, and a dummy signal generator 110.

As mentioned above, the signal at the input 102 includes an amplitude modulated "source" signal including a transmit signal, amplitude modulated receive signal, and a jammer signal (which may be amplitude modulated, or not). The transmit signal exemplifies one type of "bleed-over" signal, since it is bleeds over onto the receive path. The linearization circuit 101 also receives a signal 103 replicating the transmit signal, from the path 152, duplexer 154, or other source. The envelope detector 106 measures, quantifies, estimates, calculates, or otherwise determines the envelope of the transmit signal 103. This is referred to as the "transmit envelope."

The envelope detector 106 may be implemented by any of various widely known envelope detectors, such as a circuit structure of one or more diodes, capacitors, resistors, etc. Alternatively, if envelope information is already known, the source envelope description may arrive at the complement generator 104 from another source (not shown), for example, in digital form. In this case, the envelope detector 106 may be omitted. For instance, since the transmit signal constitutes the primary amplitude modulated component of the source signal, the receive signal being significantly weaker, information describing the transmit signal's envelope may be obtained from the transmit path and used as the transmit envelope.

The envelope complement calculator 108 calculates a "dummy" envelope that is complementary to the transmit envelope. In a broad sense, the dummy envelope is calculated so that, if added to the transmit envelope, the result would be a constant. Thus, in one basic implementation, the value of the dummy envelope at any time may be calculated by subtracting the transmit envelope from a constant. Computation of the dummy envelope is described in greater detail below.

In one example, the complement calculator 108 may be constructed using discrete circuitry such as transistors. Alternatively, the complement calculator 108 may be implemented by software, especially in the event that the envelope detector 106 is omitted and the transmit envelope description arrives in digital form.

The dummy signal generator 110 modulates the amplitude of a carrier signal to provide a dummy signal that is characterized by the dummy envelope. As a representative example, without any intended limitation, the dummy signal generator 110 may comprise an oscillator and a multiplier, where the multiplier computes the product of the carrier and the dummy envelope calculated by 108. This may be achieved using, for example, polar modulation. In a different example, the dummy signal generator 110 may comprise a quadrature modulator, including circuitry to compute I and Q components based upon the computed dummy envelope, and a multiplier to compute the product of such I and Q components. Regardless of the modulation scheme, the one or more frequencies (frequency bandwidth) of the dummy signal 105 intentionally differ from the bandwidth of the receive signals ("receive frequency bandwidth") in order to aid in removing the dummy signal from the final output 118 as discussed in greater detail below.

Output of the complement generator 104 at 105 therefore comprises a dummy signal whose envelope is described by the dummy envelope. This signal has a frequency bandwidth determined by the dummy signal generator 110. An adder 112 combines the dummy signal 105 with the original source signal 102 to provide a conditioned output 113. This signal is fed to the amplifier 162, which processes its input 114a and provides an output at 114b.

In addition to the linearization circuitry 101, the receive signal path optionally includes various post-processing components between the amplifier 162 and the final output 118. Namely, a filter 116 serves to remove signals of the transmit, jammer, and dummy frequencies as well as any "intermodulation products," which means signals having the dummy frequency bandwidth as well as signals created by the joint interaction of the transmit signal and the dummy signal with the nonlinearity of the amplifier 162. The filter 116 may comprise one or more bandpass filters, for example.

Multiple Dummy Signal Generators

The foregoing example depicts an example with one dummy signal generator, therefore utilizing a single dummy signal. The use of a single dummy signal is effective to cure cross-modulation, as may be caused by third order amplitude dependent (AM/AM and AM/PM) nonlinearities as illustrated herein. If higher order nonlinearities are involved, more dummy signals are required, as explained below.

Figure 1C:
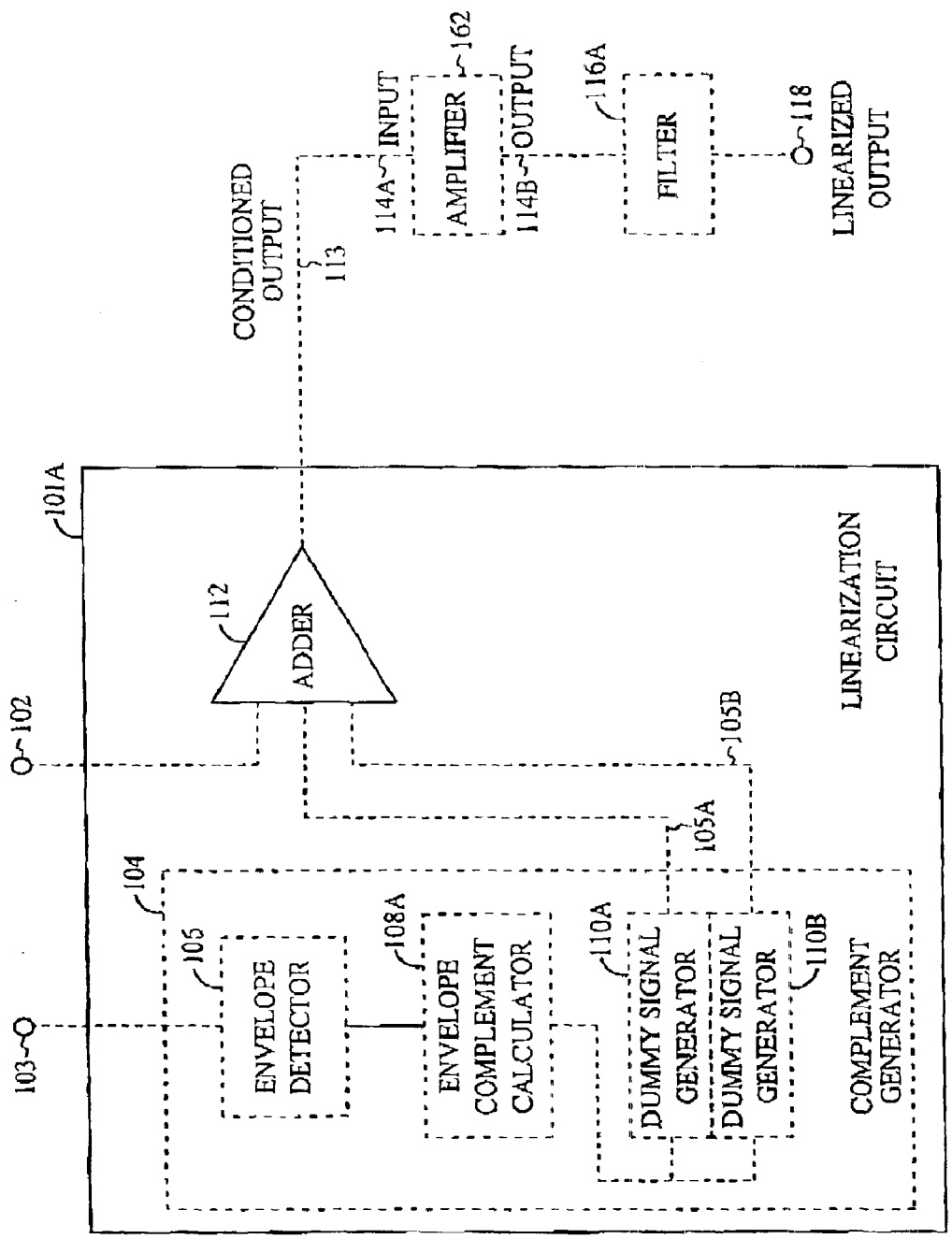
FIG. 1C is a block diagram of the hardware components and interconnections of a linearization circuit with multiple complement generators.

In this case, a linearization circuit 101a of different structure is contemplated to implement multiple dummy signal generators 110a, 110b, as shown in FIG. 1C. To the extent that components of the circuit 101a (FIG. 1C) differ from those of the circuit 101 (FIG. 1B), they are given different reference numerals and discussed as follows. The envelope detector 106 performs the same function in FIG. 1B as in FIG. 1A. Namely, the envelope detector 106 measures, quantifies, estimates, calculates, or otherwise determines the source envelope.

Although the envelope complement calculator 108a operates in a generally similar fashion as the calculator 108 of FIG. 1B, the calculator 108 includes some additional functionality. Namely, the envelope complement calculator 108a calculates two dummy envelopes (rather than one), where these dummy envelopes are combinedly complementary to the transmit envelope. An exemplary approach to generating multiple dummy envelopes is discussed in greater detail below.

In FIG. 1C, there are multiple dummy signal generators 110a, 110b. Each dummy signal generator 110a, 110b modulates a different carrier signal to provide a dummy signal exhibiting a different one of the calculated dummy envelopes. Like the single dummy signal generator 110, each dummy signal generator 110a, 110b in the embodiment of FIG. 1C may utilize polar or quadrature modulation, for instance.

Output of the dummy signal generators 110a, 110b, which comprises dummy signals on lines 105a, 105b, is directed to the adder 112. The adder 112 combines the dummy signals 105a, 105b with the source signal 102. Accordingly, the adder 112 provides a conditioned output 113. This signal 113 is fed to the amplifier 162 at 114a. The amplifier 162 processes the input 114a and provides an output at 114b.

Like the filter 116 of FIG. 1B, the filter 116a removes dummy signals (as well as signals created by the joint interaction of the transmit signal and the dummy signals) from the nonlinear circuit's output 114b. However, since the linearization circuit 101a utilizes multiple dummy signals 105a, 105b, the filter 116a is configured to remove signals of each dummy frequency bandwidth as well as any intermodulation products of such signals.

Exemplary Digital Data Processing Apparatus

As mentioned above, data processing entities such as envelope detectors, envelope complement calculators, dummy signal generators, adders, filters, or any one or more of their subcomponents may be implemented in various forms. One example is a digital data processing apparatus, as exemplified by the hardware components and interconnections of the digital data processing apparatus 200 of FIG. 2.

The apparatus 200 includes a processor 202, such as a microprocessor, personal computer, workstation, controller, microcontroller, state machine, or other processing machine, coupled to a storage 204. In the present example, the storage 204 includes a fast-access storage 206, as well as nonvolatile storage 208. The fast-access storage 206 may comprise random access memory ("RAM"), and may be used to store the programming instructions executed by the processor 202. The nonvolatile storage 208 may comprise, for example, battery backup RAM, EEPROM, flash PROM, one or more magnetic data storage disks such as a "hard drive", a tape drive, or any other suitable storage device. The apparatus 200 also includes an input/output 210, such as a line, bus, cable, electromagnetic link, or other means for the processor 202 to exchange data with other hardware external to the apparatus 200.

Despite the specific foregoing description, ordinarily skilled artisans (having the benefit of this disclosure) will recognize that the apparatus discussed above may be implemented in a machine of different construction, without departing from the scope of the invention. As a specific example, one of the components 206, 208 may be eliminated; furthermore, the storage 204, 206, and/or 208 may be provided on-board the processor 202, or even provided externally to the apparatus 200.

Logic Circuitry

In contrast to the digital data processing apparatus discussed above, a different embodiment of the invention uses logic circuitry instead of computer-executed instructions to implement various processing entities such as those mentioned above. Depending upon the particular requirements of the application in the areas of speed, expense, tooling costs, and the like, this logic may be implemented by constructing an application-specific integrated circuit (ASIC) having thousands of tiny integrated transistors. Such an ASIC may be implemented with CMOS, TTL, VLSI, or another suitable construction. Other alternatives include a digital signal processing chip (DSP), discrete circuitry (such as resistors, capacitors, diodes, inductors, and transistors), field programmable gate array (FPGA), programmable logic array (PLA), programmable logic device (PLD), and the like.

OPERATION

Having described the structural features of the present invention, the operational aspect of the present invention is now described. As mentioned above, the operational aspect of the disclosure involves conditioning a wireless communication module's receive path to prevent transmit or other signals bled onto the receive path from modulating a relatively strong jammer signal via an amplifier or other nonlinear device, and possibly spreading the jammer signal into the frequency band occupied by weaker receive signals of interest from remote stations. By combining the amplitude modulated bleed-over signal with a prescribed dummy signal, the nonlinear device in the receive path is forced to operate in a linear regime with respect to the jammer signal, leaving the jammer signal unmodulated, or at least free from any added modulation. Optionally, the dummy, bleed-over, and jammer signals (and any other signals generated upon introduction of the dummy signal) may then be filtered from the nonlinear device's output.

Signal-Bearing Media

Figure 2:
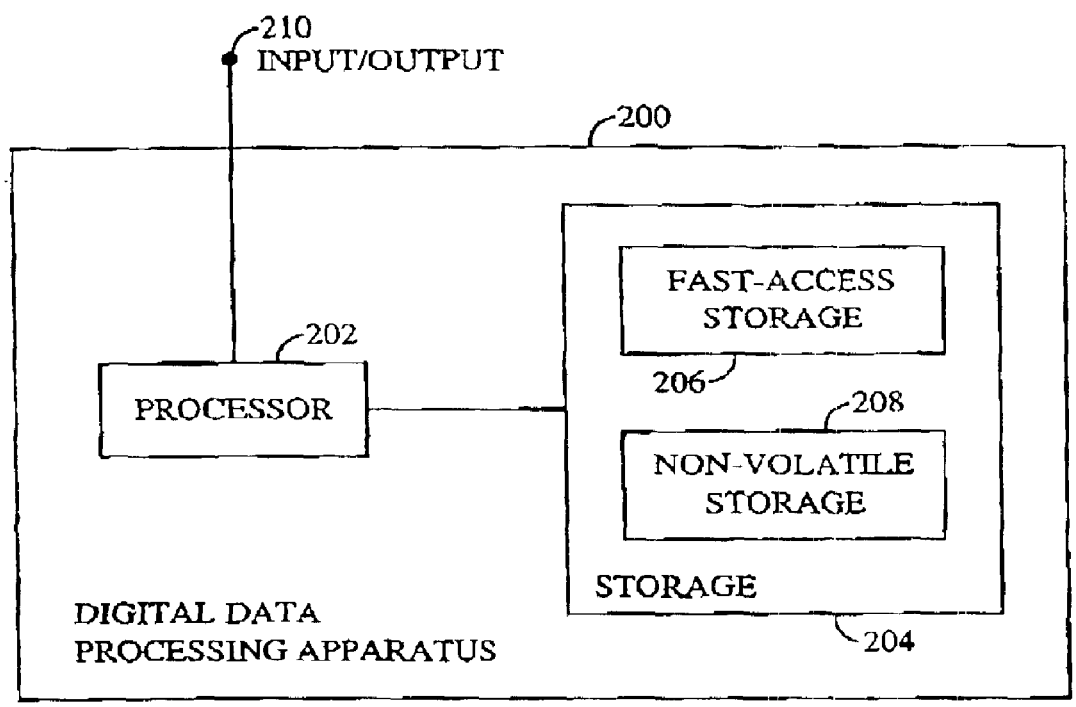
FIG. 2 is an exemplary digital data processing machine.

Wherever any functionality of the invention is implemented using one or more machine-executed program sequences, such sequences may be embodied in various forms of signal-bearing media. In the context of FIG. 2, such a signal-bearing media may comprise, for example, the storage 204 or another signal-bearing media, such as a magnetic data storage diskette 300 (FIG. 3), directly or indirectly accessible by a processor 202. Whether contained in the storage 206, diskette 300, or elsewhere, the instructions may be stored on a variety of machine-readable data storage media. Some examples include direct access storage (e.g., a conventional "hard drive", redundant array of inexpensive disks ("RAID"), or another direct access storage device ("DASD")), serial-access storage such as magnetic or optical tape, electronic non-volatile memory (e.g., ROM, EPROM, flash PROM, or EEPROM), battery backup RAM, optical storage (e.g., CD-ROM, WORM, DVD, digital optical tape), paper "punch" cards, or other suitable signal-bearing media including analog or digital transmission media and analog and communication links and wireless communications. In an illustrative embodiment of the invention, the machine-readable instructions may comprise software object code, compiled from a language such as assembly language, C, etc.

Logic Circuitry

In contrast to the signal-bearing medium discussed above, some or all of the invention's functionality may be implemented using logic circuitry, instead of using a processor to execute instructions. Such logic circuitry is therefore configured to perform operations to carry out the method aspect of the invention. The logic circuitry may be implemented using many different types of circuitry, as discussed above.

Overall Sequence of Operation

Figure 4:
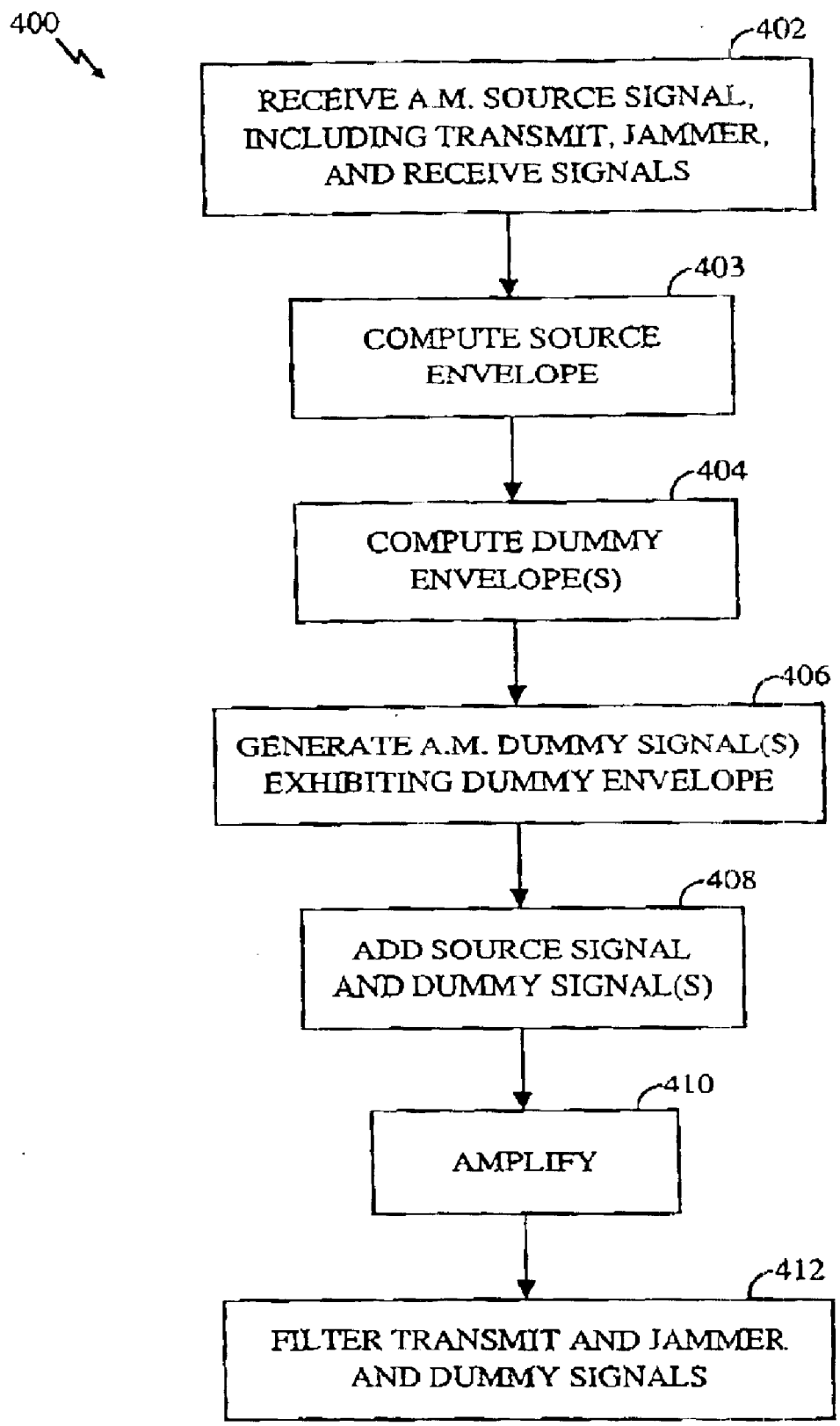
FIG. 4 is a flowchart showing an exemplary blind linearization operating sequence.

FIG. 4 shows a sequence 400 to illustrate an operational aspect of the present invention. For ease of explanation, but without any intended limitation, the example of FIG. 4 is described in the context of the transceiver 150 described above, with the linearization circuit 101 and filter 116 as shown in FIG. 1B.

Figure 5A:
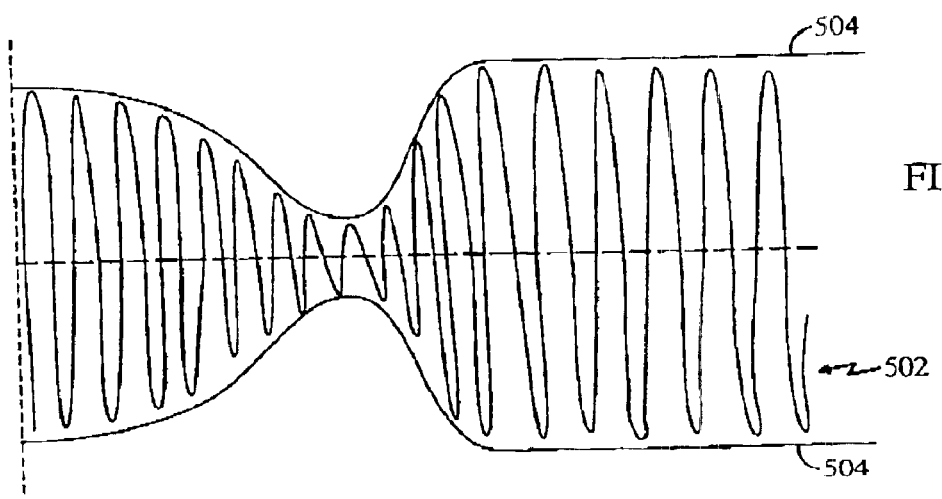
FIGS. 5A–5B are signal diagrams showing a bleed-over signal with bleed-over envelope, and a dummy signal with dummy envelope, respectively.

In step 402, the linearization circuit 101 receives signals 102 and 103. Namely, the circuit 101 receives the source signal from the duplexer 154 on the input 102, and the circuit 101 receives the transmit signal from the transmit signal path 152 at 103. The signal at 102 is referred to as the "source signal," and includes the transmit signal, jammer signal, and receive signal. The transmit signal is also called a "bleed-over" signal because it arrives on the receive signal path 159 by inadvertently bleeding over from the transmit signal path 152. The receive signal is a signal from a remote station with which the transceiver 150 is communicating, this signal arriving via the antenna 156. Unlike conventional receive signal circuitry, the source signal does not go directly to the amplifier 162, since the linearization circuit 101 is designed to perform certain pre-processing tasks to assist the amplifier 162 in processing the source signal in a linear fashion. FIG. 5A describes a representative transmit signal 502. The transmit signal 502 comprises an amplitude modulated signal of one or more frequencies that constitute a "transmit frequency bandwidth."

In step 403, the envelope detector 106 computes a transmit envelope representative of the transmit signal 103/502. FIG. 5A depicts the envelope of the transmit signal 502 at 504. The envelope detector 106 works by measuring, quantifying, estimating, calculating, or otherwise determining the envelope of the signal arriving at the input 103. The detector 106's output is called the "transmit envelope," and serves to describe the envelope 504 with analog waveform (s), digital information, or any other data depending upon the manner in which the detector 106 and/or complement calculator 108 are implemented.

Step 403 is optional, however, as the envelope detector 106 may be omitted in the event that envelope information is already known. For instance, depending upon the application, data and/or signals describing the envelope may already be available from a computer, analog circuit, or other origin separate from the linearization circuit 101. In the illustrated embodiment, where the bleed-over signal is actually the transmit signal, envelope information may be available, for example, from the transmit path 152. In this case, the input 103 need not be coupled to the complement generator 104, as the transmit envelope description arrives at the complement calculator 108 directly from another point of origin.

Figure 5B:
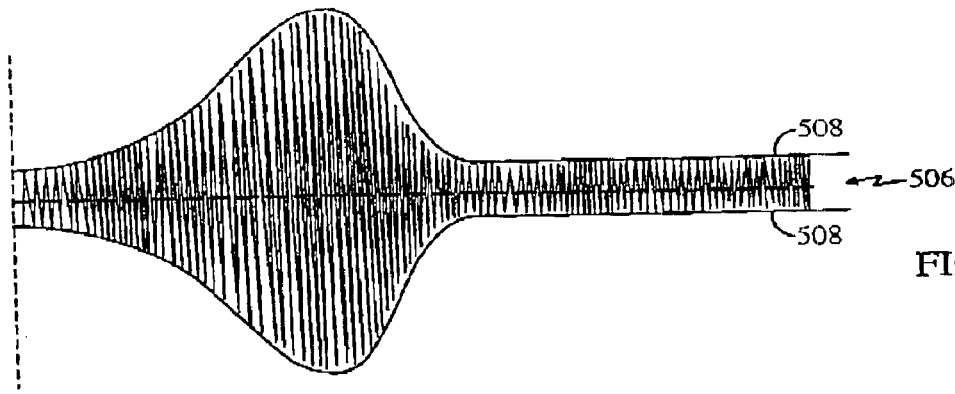

In step 404, the dummy envelope calculator 108 computes a dummy envelope based upon the transmit envelope 504 as computed by the envelope detector 106 (step 403) or as received from another point of origin. Broadly, the dummy envelope is computed to yield a predetermined constant if the source envelope 504 and dummy envelopes, at any instant of time, were to be combined. FIG. 5B shows an exemplary dummy envelope 508 that is calculated based upon the source envelope 504.

As a more particular example, the dummy signal envelope is computed such that a predetermined constant always results when the amplitudes of the transmit envelope and dummy envelope are processed by predetermined formulas and the processed results added. One such predetermined formula is expressed by Equations 1 and 2, below.

$$K = A_{se}^2 + {}^*A_{de}^2 \qquad \text{Eq. 1}$$

where: K=a constant.
$A_{se}$=the amplitude of the transmit signal envelope.
$A_{de}$=the amplitude of the dummy envelope.

In other words, the envelope complement calculator 108 in this embodiment computes the amplitude of the dummy envelope so as to satisfy Equation 2, below.

$$A_{de} = sqrt(K - A_{se}^2) \qquad \text{Eq. 2}$$

In step 406, the dummy signal generator 110 modulates a carrier signal to provide a dummy signal exhibiting the calculated dummy envelope. In the presently illustrated example, FIG. 5B shows the dummy signal as 506. The generator 110 may generate the carrier signal, for example using an oscillator, or it may receive the carrier signal from elsewhere. The carrier signal's frequency bandwidth (meaning its single frequency or frequency range if some frequency/phase modulation is used) is called the "dummy frequency bandwidth." Operation of downstream filters (discussed below) may be further simplified by judiciously selecting the dummy frequency bandwidth so that the post-nonlinear-circuit products can be readily distinguished (and removed) from the receive signal. For instance, the dummy frequency bandwidth may be chosen to be different than the receive frequency bandwidth. Furthermore, the dummy frequency bandwidth may be chosen so that the receive path's existing filtering, if any, will remove the dummy signal and the unwanted intermodulation products caused by the dummy signal. To further simplify the process of later removing artifacts of the dummy signal from the amplifier 162's output 114b, one approach is to avoid any frequency/phase modulation of the carrier signal.

Carrier modulation of step 406 may occur by quadrature modulation, polar modulation, or another of the many techniques familiar to artisans or ordinary skill in the applicable art.

In step 408, the adder 112 adds the source signal (present on the input 102) and the dummy signal 506 (present on the output 105 of the dummy signal generator 110). The output of the adder 112 may also be referred to as a "conditioned" signal 113, or a "combined" signal. In step 410, the adder 112 sends this signal to the amplifier 162.

Also in step 410, the amplifier 162 amplifies the conditioned signal 113 received at the input 114a. However, since the source signal 102 has been conditioned by addition of the dummy signal 506, the amplifier 162 is forced to process the jammer signal in a linear regime. Namely, the addition of the dummy signal prevents the transmit signal from modulating (or further modulating) the jammer signal via the amplifier 162's nonlinearity. In this sense, the amplifier 162's output 114b is linearized.

However, the output 114b still contains artifacts of the dummy signal 506 as well as other undesirables. Thus, in step 412 the filter 116 removes signals in the output 114b corresponding to the carrier signal of the generator 110, namely, signals of the dummy frequency bandwidth. The filter may also remove any "intermodulation products," for example, signals created by the joint interaction of the transmit signal and the dummy signal with the amplifier 162's nonlinearity. The filter also removes the transmit signal and the jammer signal. Thus, after filtering, the only signals remaining in the output 118 are signals attributable to the receive signal 102.

Multiple Dummy Signal Embodiment

The foregoing example depicts an example with one dummy signal generator, therefore utilizing a single dummy signal. The use of a single dummy signal is effective to cure cross-modulation, such as that caused by third order amplitude dependent (AM/AM and AM/PM) nonlinearities as illustrated herein. However, if higher order nonlinearities are involved, more dummy signals are required, as explained below.

The linearization circuit 101a implements multiple dummy signal generators 110a, 110b, as shown in FIG. 1C. To operate the circuit 101a, many of the operations 400 are performed as described above. Differences, to the extent they occur and require description, are explained below. First, although the envelope complement calculator 108a performs step 404 in a generally similar fashion as the calculator 108 of FIG. 1B, the calculator 108a performs additional duties. Namely, the envelope complement calculator 108a calculates two dummy envelopes in step 404 (rather than one), where these dummy envelopes in combination are complementary to the transmit envelope 504. This concept may be further extended to three, four, or any number of dummy envelopes that are (in combination) complementary to envelope of the transmit signal 103. Multiple dummy envelope calculation is explained in greater detail in the APPENDIX included herein, with the example of two dummy envelopes being shown.

Another difference in the multi-dummy-signal embodiment is in step 406. Namely, each of the generators 110a, 110b (FIG. 1C) modulates a different carrier signal to provide a corresponding dummy signal exhibiting a different one of the calculated dummy envelopes. The carrier signals of the generators 110a, 110b have different frequency bandwidths from each other. At common frequencies their envelopes would add, whereas the requirements of the present example call for two distinct signals (with envelopes as prescribed) that add. Each carrier signal's frequency (or frequencies, if some phase modulation is used) is different than the frequency bandwidth of the transmit signal 103 to simplify the subsequent removal of the corresponding dummy signal. To further simplify the process of removing artifacts of the dummy signals from the amplifier 162's output 114b, each carrier signal may occur at a single frequency, that is, without any phase modulation. Like the single-dummy-signal embodiment, each dummy signal generator 110a, 110b may utilize modulation such as polar or quadrature modulation.

Another difference in the multi-dummy signal embodiment occurs in step 408. Here, the adder 112 combines outputs 105a, 105b from multiple different dummy signal generators 110a, 110b with the source signal 102. As another difference, the filter 116a in step 412 must filter out all dummy signals, namely, it must filter signals of each dummy frequency bandwidth (arising from each of the generators 110a, 110b). As with the single-dummy-signal embodiment, any applicable intermodulation products are also filtered.

OTHER EMBODIMENTS

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

Moreover, the previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The word "exemplary" is used herein to mean "serving as an example, instance, or illustration." Any embodiment described herein as "exemplary" is not necessarily to be construed as preferred or advantageous over other embodiments.

APPENDIX

1 Executive Summary

A circuit increases a signal's bandwidth when its gain depends on the signal's amplitude. Adding a linearizing signal of related amplitude, but with unrelated phase, to the input can reduce this dependence. Because the phase is unrelated, the linearizing signal can be at any convenient frequency. The linearizing signal causes intermodulation products, but these can be filtered if the signal frequencies are well chosen. The method is 'blind' in the sense that, apart from the usual AM-AM and AM-PM[1] assumption, no knowledge of the nonlinearity is assumed.

The report examines essential principles. While practical aspects are given due consideration, detailed implementation issues are not addressed.

2 Introduction

Consider an input signal to a nonlinear circuit (a transmitter amplifier, for example), given by $$x = A(t)\cos(\phi(t) + \omega_0 t). \quad (1)$$

Here, $A(t)$ is the amplitude modulation, $\phi(t)$ is the phase modulation, and $\omega_0$ is the center frequency. Using the complex low-pass form, we have $$\tilde{x} = A(t)\exp i\phi(t). \quad (2)$$

The output signal is given by $$y = G(A)A(t)\cos(\phi(t) + \omega_0 t + \gamma(A)), \quad (3)$$

Here, $G(A)$ governs the amplitude response (AM-AM) and $\gamma(A)$ governs the phase response (AM-PM). In complex low-pass form, the output is $$\tilde{y} = G(A)\exp(i\gamma(A))\tilde{x}, \quad (4)$$

---

[1] AM-AM = amplitude-modulation to amplitude-modulation. AM-PM = amplitude-modulation to phase-modulation.

where the complex gain is $$CG = G(A)\exp i\gamma(A). \quad (5)$$

The complex gain can be represented as a simple polynomial[2]

$$CG = k_1 + k_3|\tilde{x}|^2 + k_5|\tilde{x}|^4 + \ldots + k_N|\tilde{x}|^{N-1}. \quad (6)$$

Here $k_1, k_3$ and $k_5$ are related to the gain $G$ (dB) and output third-order and fifth order intercept points (dBW, for $x$ in Volts) by $$|k_1| = 10^{G/20}, \quad (7)$$

$$|k_3| = \frac{2}{3R_0} 10^{3G/20 - IP3/10}, \quad (8)$$

$$|k_5| = \frac{2}{5R_0} 10^{G/4 - IP5/5}, \quad (9)$$

where $R_0$ is the input/output resistance [Ha81]. Similar relationships with higher order intercept points may be derived. This model assumes that the gain and nonlinearity are not functions of frequency — a reasonable assumption as long as the frequencies involved are not too widespread.

3 Linearization by Cross-modulation

In this section we explain how to linearizes the gain of the desired signal, $T(t)$ say, by adding one or more *linearizing* signals at the input of the nonlinearity. The linearizing signals are related in amplitude to $T(t)$, but not in phase. Furthermore, we assume that the added signal, or signals, are positioned in frequency so that the various intermodulation products can be filtered — leaving $T(t)$ unaffected.

For the most general case considered here, a composite of three signals forms the input to the nonlinearity. First, $\tilde{T}(t) = A_T(t)\exp i\phi_T(t)$ is the signal that we wish to linearly amplify. Second, $\tilde{L}(t) = A_L(t)\exp i\phi_L(t)$, is a signal to linearizes the amplification — principally reducing the third-order nonlinearity. Finally, $\tilde{M}(t) = A_M(t)\exp i\phi_M(t)$ may be added to reduce both the third and fifth order nonlinearity. Thus,

---

[2] The basis functions should, perhaps, be chosen with respect to the input signal [Blachman79].

Blind Linearization Using Cross-Modulation

$$\tilde{x} = A_T(t)\exp i\phi_T(t) + A_L(t)\exp i\phi_L(t) + A_M(t)\exp i\phi_M(t). \qquad (10)$$

Using equation (6), the third order output term (neglecting the coefficient $k_3$) is $$|\tilde{x}|^2 \tilde{x} = \begin{array}{l} 2A_T^2 A_L \exp i(2\phi_T - \phi_L) + \\ 2A_T^2 A_M \exp i(2\phi_T - \phi_M) + \\ 2A_L^2 A_M \exp i(2\phi_L - \phi_M) + \\ 2A_L^2 A_T \exp i(2\phi_L - \phi_T) + \\ 2A_M^2 A_T \exp i(2\phi_M - \phi_T) + \\ 2A_M^2 A_L \exp i(2\phi_M - \phi_L) + \end{array} \right\} \text{Intermodulation}$$

$$\begin{array}{l} A_T A_L A_M \exp i(-\phi_T + \phi_L + \phi_M) + \\ A_T A_L A_M \exp i(\phi_T - \phi_L + \phi_M) + \\ A_T A_L A_M \exp i(\phi_T + \phi_L - \phi_M) + \end{array} \right\} \text{Triple-Beat}$$

$$\begin{array}{l} 2A_L^2 A_T \exp i\phi_T + \\ 2A_M^2 A_T \exp i\phi_T + \\ 2A_M^2 A_L \exp i\phi_L + \\ 2A_T^2 A_L \exp i\phi_L + \\ 2A_T^2 A_M \exp i\phi_M + \\ 2A_L^2 A_M \exp i\phi_M + \end{array} \right\} \text{Cross-Modulation}$$

$$\begin{array}{l} A_T^3 \exp i\phi_T + \\ A_L^3 \exp i\phi_L + \\ A_M^3 \exp i\phi_M \end{array} \right\} \text{Self-Modulation} \qquad (11)$$

The terms that effect the amplification of $T(t)$ are the coefficients of $\exp(i\phi_T)$ — without either $\exp(i\phi_L)$ or $\exp(i\phi_M)$. For the moment we set $A_M = 0$, so that the complex gain of $T(t)$ is $$CG_T = k_1 + k_3\left(A_T^2 + 2A_L^2\right). \qquad (12)$$

Blind Linearization Using Cross-Modulation

The contribution from $A_L(t)$ is due to *cross-modulation*. To linearizes the gain of $T(t)$, we set $$A_T^2 + 2A_L^2 = K_1 = \text{constant}. \tag{13}$$

This procedure is 'blind' in the sense that no knowledge of the third order nonlinearity coefficient, $k_3$, is required.

While equation (13) removes the effect of $k_3$ on the third order nonlinearity output, it also spreads the influence of the other coefficients, so that the new complex gain of $T(t)$ is (for example, for $N = 7$)

$$CG_T = k_1' + k_3' A_T^2 + k_5' A_T^4 + k_7' A_T^6, \tag{14}$$

where, $$k_1' = k_1 + K_1 k_3 + \frac{3}{4} K_1^2 k_5 + \frac{1}{2} K_1^3 k_7, \tag{15}$$

$$k_3' = \frac{3}{2} K_1 k_5 + 3 K_1^2 k_7, \tag{16}$$

$$k_5' = \frac{-5}{4} k_5 - \frac{3}{2} K_1 k_7, \tag{17}$$

$$k_7' = -k_7. \tag{18}$$

The new linear gain, $k_1'$ in equation (15), is influenced by all the original coefficients, $k_1, k_3, k_5, k_7$. The new third order coefficient, $k_3'$, is not influenced by the original third order coefficient, $k_3$ – but *is* affected by $k_5$ and $k_7$. Similarly, $k_5'$ now has a contribution from $k_7$. The new seventh order coefficient, $k_7'$, is unaffected apart from its sign.

For the method to improve the linearity, despite the increased influence of the higher order coefficients, $K_1$ must be as small as possible, and the nonlinearity should be dominantly third order.

As an example, we consider the following commonly quoted nonlinearity [Saleh81], $$CG = \frac{k_1}{1 + A_T^2} \exp\left( j \frac{\pi}{3} \frac{A_T^2}{1 + A_T^2} \right). \tag{19}$$

The gain and phase of $CG$ appear in figures 1(a) and 2(a). When expanded in a Taylor series about $A_T = 0$, with 15 dB of linear gain, we find $$k_1 = 5.623$$
$$k_3 = -5.623 + j5.888$$
$$k_5 = 2.540 - j11.777$$
$$k_7 = 3.627 + j16.589$$
(20)

Here we have assumed $K_1 = 0.2$, which corresponds to a maximum peak amplitude of $A_r$ of 0.447 Volts.

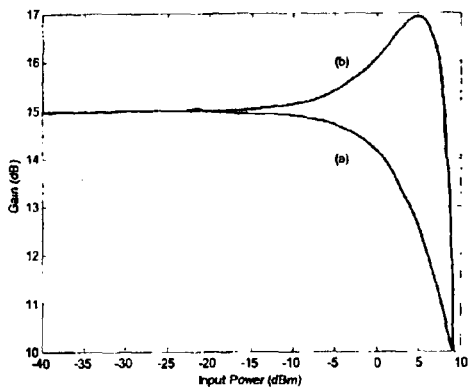

Figure 1 Complex gain magnitude: (a) equation (19), (b) 5$^{th}$ order nonlinearity.

From equations (15) to (18), we find the modified coefficients of the nonlinearity to be $$k_1' = 4.589 + j0.891$$
$$k_3' = 1.197 - j1.542$$
$$k_5' = -4.263 + j9.744$$
$$k_7' = -3.627 - j16.589$$
(21)

For nonlinearities with gain compression, the power of the added linearizing signal reduces the overall gain. Hence $|k_1'|$ is slightly smaller than $|k_1|$. It is straightforward to calculate the improvement in third order intercept to be 6.2 dB. To ensure that, in improving the third order nonlinearity, the other terms have not been overly aggravated we simulate the nonlinearity of equation (19) with an IS-95 CDMA waveform.

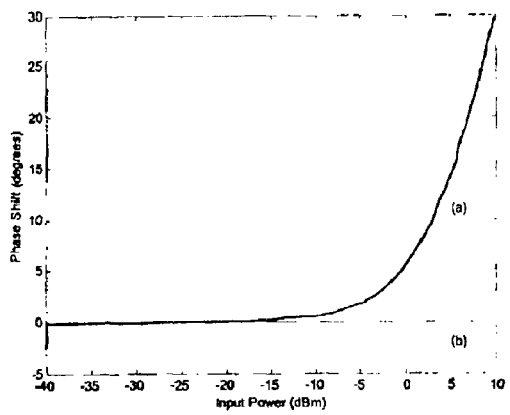

Figure 2 Complex gain phase shift: (a) equation (19), (b) linear phase.

We consider a typical digital wireless transmitter architecture. Random binary data is mapped to symbols, filtered, and converted to an analog signal. Although OQPSK is used for the transmitter signal the technique can be applied to any signaling format. Independent 'm'-sequences of length $2^{19}-1$ supply the raw in-phase and quadrature binary data. The data is mapped to the OQPSK constellation and then interpolated at four times the input rate by the 'pulse-shaping' filter[3]. A zero-order hold (ZOH) follows with 128 samples per 'hold' to represent the analog waveform. The output of the ZOH is passed to the reconstruction filter[4]. The output of the reconstruction filter drives the complex gain of equation (19).

Figure 3:
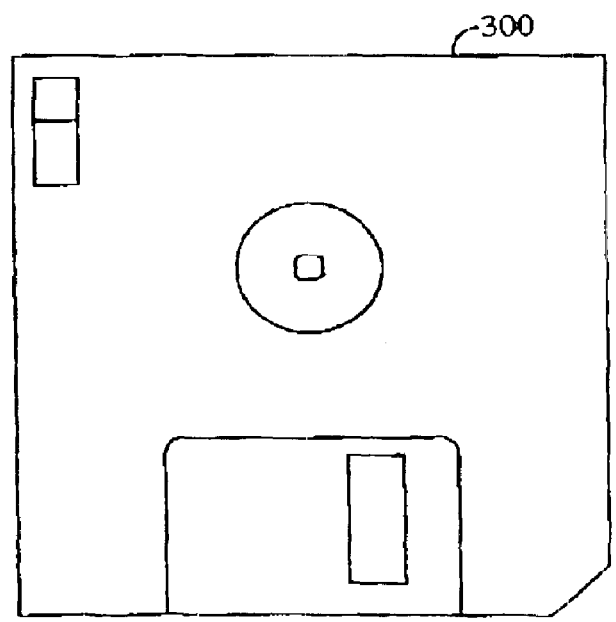
FIG. 3 is an exemplary signal bearing medium.

Figure 3 shows the output power spectral density (PSD). The PSD is estimated using Welch's method with sample length $2^{15}$ (Hanning) windowed periodograms [Oppenheim89]. Anticipating an application to CDMA systems, the frequency is given in units of the spreading, or 'chip', frequency, $f_{CHIP}$.

Both the linearized and un-linearized outputs of the nonlinearity are shown. The output power is 11 dBm in both cases. The input power has been increased 1 dB for the linearized case, as the linearizing signal reduces the gain of the nonlinearity. The output power of the linearizing signal us 15.2 dBm. The power in the first adjacent channel is improved by 10-15 dB, while the power in the second adjacent channel is degraded by 4-5 dB. In practice, whether this is beneficial will depend on the nonlinearity and the requirements in the neighboring channels.

---

[3] Adopted, for convenience, from TIA/EIA IS-95, "Mobile Station – Base Station Compatibility Standard for Dual-Mode Wideband Spread-Spectrum Cellular Systems", Telecommunications Industry Association July, 1993..

[4] Chebyshev, type-II, $5^{th}$ order, stop-band 80 dB down at 3/256 of the sampling frequency Figure 4 shows an expanded view of the power spectral density. The linearizing signal ('L') has been placed relatively close to the wanted signal ('T') to minimize the sampling requirements of the simulation. In practice, the linearizing signal's frequency should be chosen to ease filtering requirements.

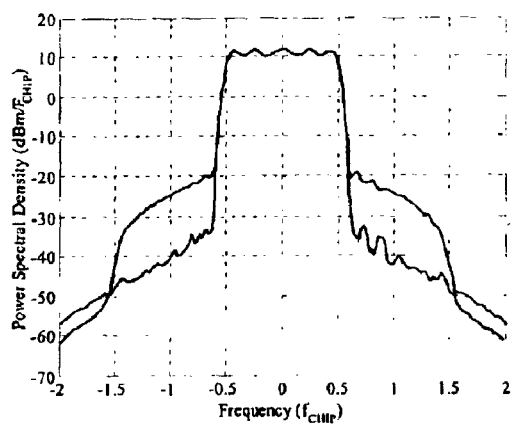

Figure 3 Power spectral density of the nonlinearity output with and without the added linearizing signal.

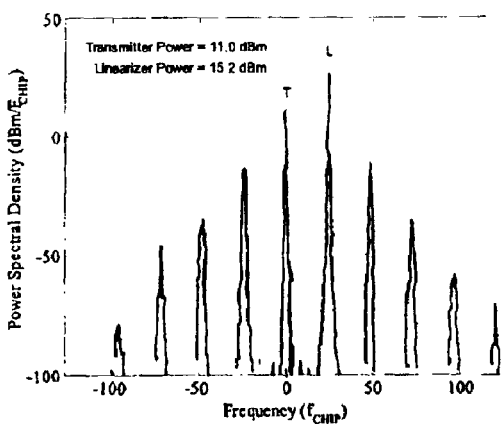

Figure 4 Power spectral density of the nonlinearity output: wide view showing wanted signal (T) and linearizing signal (L).

With the aid of a second linearizing signal, $M(t) = A_M(t)\exp i\phi_M(t)$, it is possible to further improve the linearity. Just as the first added signal removes the contribution of the third order coefficient, a second added signal can be added to remove the effect of the fifth order coefficient.

Equation (13) becomes a constraint on both $A_L$ and $A_M$ $$A_T^2 + 2(A_L^2 + A_M^2) = K_1. \tag{22}$$

To remove the contribution of the fifth order coefficient, $k_5$, we require $$A_T^4 + 6A_T^2(A_L^2 + A_M^2) + 3(A_L^2 + A_M^2)^2 + 6A_L^2 A_M^2 = K_2. \tag{23}$$

Equations (22) and (23) must be met simultaneously. To this end it is convenient to define $$P_1 = A_L^2 + A_M^2 = \frac{1}{2}(K_1 - A_T^2), \tag{24}$$

$$P_2 = A_L^2 A_M^2 = \frac{1}{6}\left(-A_T^4 - 6A_T^2 P_1 - 3P_1^2 + K_2\right), \tag{25}$$

from which we may solve for the two linearizing signals $$A_L^2 = \frac{P_1}{2} \pm \sqrt{\frac{P_1^2}{4} - P_2}, \tag{26}$$

$$A_M^2 = P_1 - A_L^2. \tag{27}$$

As both $A_L$ and $A_M$ must be greater than or equal to zero at all times, we also require $$\frac{P_1^2}{4} > P_2 \tag{28}$$

and $$P_2 > 0 \tag{29}$$

from which we deduce $$A_T^4 - \frac{6}{7}K_1 A_T^2 - \frac{9}{7}K_1^2 + \frac{8}{7}K_2 < 0 \tag{30}$$

and $$A_T^4 - \frac{6}{5}K_1 A_T^2 - \frac{3}{5}K_1^2 + \frac{4}{5}K_2 > 0 \tag{31}$$

which must hold for all values of $A_r$. One solution for $K_1$ and $K_2$ that satisfies equations (30) and (31) is $$K_1 = \frac{\max(A_j^2)}{\frac{3}{5}\sqrt{\frac{21}{350}}} \quad (32)$$

$$K_2 = \frac{63}{56}K_1^2 \quad (33)$$

This approach is suited to nonlinearities with gain expansion, as, with gain compression, the power in $L(t)$ and $M(t)$ (as determined by $K_1$ and $K_2$) decreases the overall gain, and reduces the output power. If the input power is increased to compensate, then the gain may reduce still further.

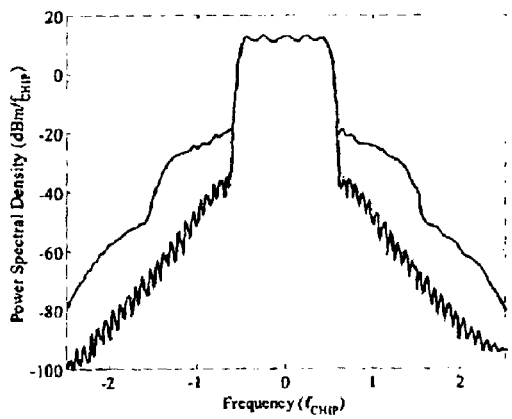

Figure 5 Power spectral density of the nonlinearity output with two added linearizing signals: close-up of wanted signal.

Figure 5 shows the power spectral density at the output of the nonlinearity with both $L(t)$ and $M(t)$ added at the input. The power of the wanted signal is 12 dBm. The linearizing signals, $L(t)$ and $M(t)$, are not shown but have output powers of 16.6 dBm 20.6 dBm respectively. In this case the nonlinearity (shown in figure 1(b) and figure 2(b)) *only* has first, third and fifth order terms — so the linearized spectrum is nearly ideal. The complex gain of equation (19) was not used, as with both a high-order nonlinearity and input signals at three frequencies, the intermodulation products are extensive and difficult to manage within the restricted simulation bandwidth. Therefore, figure 5 is optimistic as it does not include the influence of seventh and higher order terms.

In principle, more signals may be added to achieve higher orders of compensation. However, the benefit may diminish rapidly, as the power required for the linearizing signals increases.

4 Conclusion

A technique to linearizes a circuit by adding one or more signals has been introduced. The method does not assume any knowledge of the strength of the nonlinearity. However, some mild constraints on the nonlinearity (such that it is predominantly third order) will be required in practice.

5 References

[Blachman79] Blachman, N.M., "The Output Signals and Noise from a Nonlinearity with Amplitude-Dependent Phase Shift", IEEE Transactions on Information Theory, Vol. IT-25, No. 1, January 1979, 77-79.

[Ha81] Ha, T.T., "Solid State Microwave Amplifier Design", John Wiley and Sons, 1981.

[Oppenheim89], Oppenheim, A.V. and Schafer, R.W., " Discrete-Time Signal processing", Prentice-Hall, 1989.

[Saleh81] Saleh, A.A.M, "Frequency Independent and frequency-dependent models of TWT amplifiers," IEEE

What is claimed is:

1. A method of canceling cross-modulation in a wireless communications module including a receive path, comprising operations of:
- in the receive path, receiving a source signal including an amplitude modulated bleed over signal, a jammer signal, and a receive signal having a receive frequency bandwidth;
- computing a dummy envelope that would yield a predetermined constant if an envelope of the bleed-over signal and the dummy envelope were to be processed by predetermined formulas and the processed envelopes added, the predetermined formulas comprising squaring the bleed-over envelope and squaring the dummy envelope;
- creating an amplitude modulated dummy signal exhibiting the dummy envelope and occupying a dummy frequency bandwidth that differs from the receive frequency bandwidth;
- adding the source signal and the dummy signal to form a combined signal;
- directing the combined signal to a nonlinear device in the receive path.

2. An apparatus comprising circuitry of multiple interconnected electrically conductive elements configured to perform operations to cancel cross-modulation in a wireless communications module having a receive path receiving a source signal including an amplitude modulated bleed-over signal, a jammer signal, and a receive signal having a receive frequency bandwidth, the operations comprising:
- computing a dummy envelope that would yield a predetermined constant if an envelope of the bleed-over signal and the dummy envelope were to be processed by predetermined formulas and the processed envelopes added, the predetermined formulas comprising squaring the bleed-over envelope and squaring the dummy envelope;
- creating an amplitude modulated dummy signal exhibiting the dummy envelope and occupying a dummy frequency bandwidth that differs from the receive frequency bandwidth;
- adding the source signal and the dummy signal to form a combined signal;
- directing the combined signal to a nonlinear device in the receive path.

3. Receive path circuitry for a wireless communications apparatus, comprising:
- a receive input receiving a source signal including an amplitude modulated bleed-over signal, a jammer signal, and a receive signal having a receive frequency bandwidth;
- an envelope computer computing a dummy envelope that would yield a predetermined constant if an envelope of the bleed-over signal and the dummy envelope were to be processed by predetermined formulas and the processed envelopes added, the envelope computer configured such that the predetermined formulas comprise squaring the bleed-over envelope and squaring the dummy envelope;
- a dummy signal generator utilizing the dummy envelope to provide an amplitude modulated dummy signal exhibiting the dummy envelope and occupying a dummy frequency bandwidth that differs from the receive frequency bandwidth;
- an adder coupled to the receive input and the dummy signal generator to add the source signal and the dummy signal to form a combined signal.

* * * * *